(12) United States Patent
Niimi et al.

(10) Patent No.: US 10,068,983 B2
(45) Date of Patent: *Sep. 4, 2018

(54) HIGH-K METAL GATE

(71) Applicant: Texas Instruments Incorporated, Dallas, TX (US)

(72) Inventors: Hiroaki Niimi, Dallas, TX (US); James Joseph Chambers, Dallas, TX (US)

(73) Assignee: TEXAS INSTRUMENTS INCORPORATION, Dallas, TX (US)

( * ) Notice: Subject to any disclaimer, the term of this patent is extended or adjusted under 35 U.S.C. 154(b) by 38 days.

This patent is subject to a terminal disclaimer.

(21) Appl. No.: 15/222,262

(22) Filed: Jul. 28, 2016

(65) Prior Publication Data

US 2016/0336422 A1 Nov. 17, 2016

Related U.S. Application Data

(63) Continuation of application No. 14/142,323, filed on Dec. 27, 2013, now Pat. No. 9,431,509.

(Continued)

(51) Int. Cl.
| | |
|---|---|
| *H01L 29/49* | (2006.01) |
| *H01L 29/51* | (2006.01) |
| *H01L 27/092* | (2006.01) |
| *H01L 21/8238* | (2006.01) |
| *H01L 21/28* | (2006.01) |
| *H01L 29/66* | (2006.01) |
| *H01L 29/78* | (2006.01) |

(Continued)

(52) U.S. Cl.
CPC .... *H01L 29/4966* (2013.01); *H01L 21/28088* (2013.01); *H01L 21/28518* (2013.01); *H01L 21/823814* (2013.01); *H01L 21/823828* (2013.01); *H01L 21/823842* (2013.01); *H01L 21/823857* (2013.01); *H01L 21/823864* (2013.01); *H01L 27/092* (2013.01); *H01L 29/0847* (2013.01); *H01L 29/517* (2013.01); *H01L 29/66545* (2013.01); *H01L 29/7833* (2013.01)

(58) Field of Classification Search
CPC ......... H01L 29/4966; H01L 21/823828; H01L 29/517; H01L 21/823857; H01L 20/0847; H01L 29/66545; H01L 21/28518; H01L 27/092; H01L 21/82384; H01L 21/28088
See application file for complete search history.

(56) References Cited

U.S. PATENT DOCUMENTS

| | | | |
|---|---|---|---|
| 6,815,285 | B2 | 11/2004 | Choi et al. |
| 6,956,278 | B2 | 10/2005 | Herner |

(Continued)

*Primary Examiner* — William Coleman
(74) *Attorney, Agent, or Firm* — Jacqueline J. Garner; Charles A. Brill; Frank D. Cimino

(57) ABSTRACT

An integrated circuit containing metal replacement gates may be formed by forming a nitrogen-rich titanium-based barrier between a high-k gate dielectric layer and a metal work function layer of a PMOS transistor. The nitrogen-rich titanium-based barrier is less than 1 nanometer thick and has an atomic ratio of titanium to nitrogen of less than 43:57. The nitrogen-rich titanium-based barrier may be formed by forming a titanium based layer over the gate dielectric layer and subsequently adding nitrogen to the titanium based layer. The metal work function layer is formed over the nitrogen-rich titanium-based barrier.

20 Claims, 10 Drawing Sheets

Related U.S. Application Data

Figure 1:
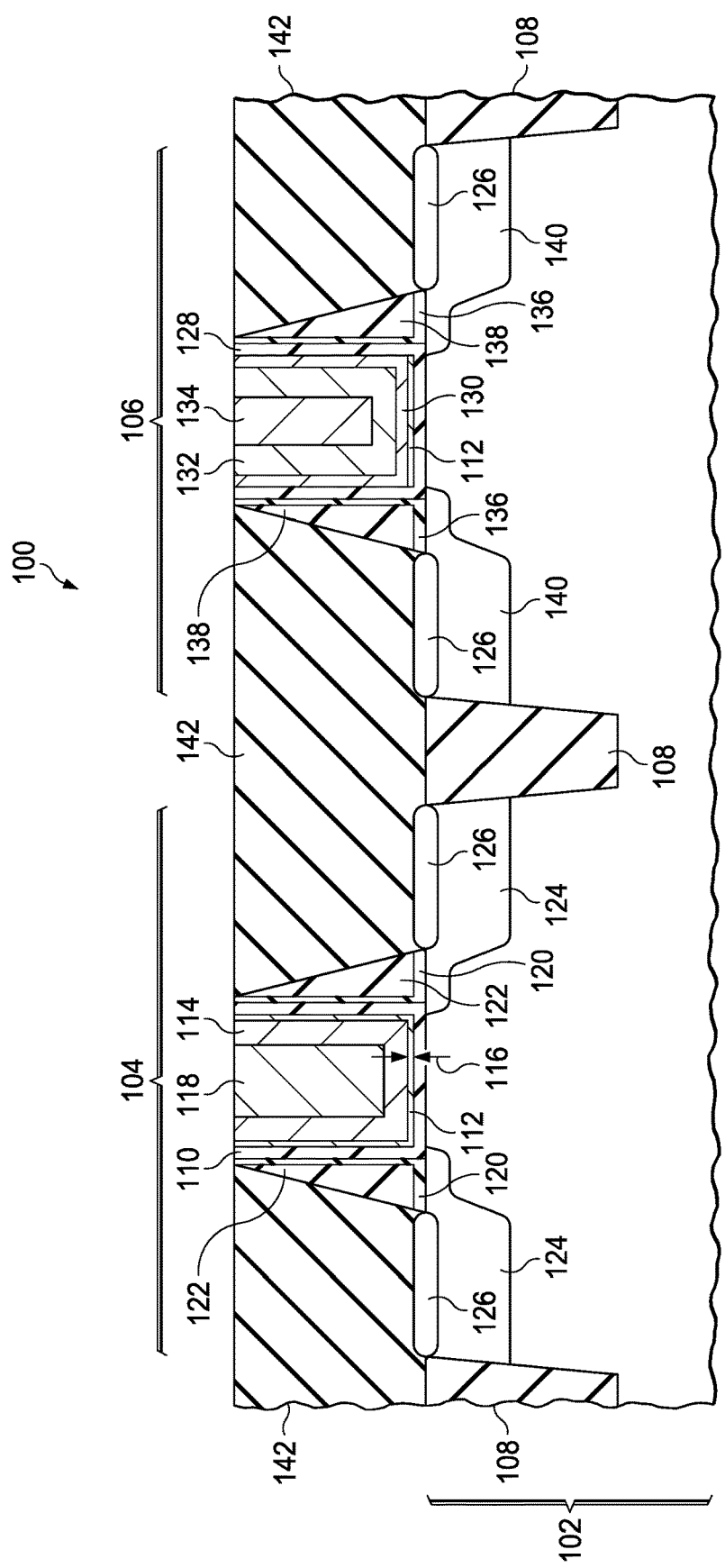

(60) Provisional application No. 61/747,708, filed on Dec. 31, 2012.

(51) Int. Cl.
*H01L 21/285* (2006.01)
*H01L 29/08* (2006.01)

(56) References Cited

U.S. PATENT DOCUMENTS

| | | | |
|---|---|---|---|
| 7,923,319 B2 | 4/2011 | Futase et al. | |
| 8,426,943 B2 * | 4/2013 | Kim | H01L 21/28273 257/209 |
| 8,580,641 B2 * | 11/2013 | Lu | H01L 27/1104 257/369 |
| 8,847,333 B2 | 9/2014 | Yu et al. | |
| 9,431,509 B2 * | 8/2016 | Niimi | H01L 29/517 |
| 2010/0151676 A1 * | 6/2010 | Ritchie | C23C 16/34 438/660 |
| 2010/0227472 A1 * | 9/2010 | Futase | H01L 21/02063 438/653 |
| 2013/0087856 A1 * | 4/2013 | Ortolland | H01L 21/28088 257/365 |

\* cited by examiner

HIGH-K METAL GATE

CROSS-REFERENCE TO RELATED APPLICATIONS

This application is a continuation of U.S. Nonprovisional patent application Ser. No. 14/142,323, filed Dec. 27, 2013, which claims the benefit of U.S. Provisional Application Ser. No. 61/747,708, filed Dec. 31, 2012, the contents of both of which are herein incorporated by reference in its entirety.

FIELD OF THE INVENTION

This invention relates to the field of integrated circuits. More particularly, this invention relates to replacement metal gate transistors in integrated circuits.

BACKGROUND OF THE INVENTION

It is desirable form metal replacement gate p-channel metal oxide semiconductor (PMOS) transistors to have gates with work functions greater than 4.85 electron-volts (eV) and more particularly work functions of approximately 5.10 eV. Oxygen atoms from the gate dielectric layers, especially those containing hafnium, diffuse into the metal gates, disadvantageously resulting in reduced work functions of the gates and higher threshold voltages of the PMOS transistors. Dielectric barrier layers which are thick enough to significantly reduce oxygen diffusion undesirably cause reduced gate dielectric capacitances and higher threshold voltages.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing metal replacement gates may be formed by forming a nitrogen-rich titanium-based barrier between a high-k gate dielectric layer and a metal work function layer of a PMOS transistor. The nitrogen-rich titanium-based barrier is less than 1 nanometer thick and has an atomic ratio of titanium to nitrogen of less than 43:57. The nitrogen-rich titanium-based barrier may be formed by forming a titanium based layer over the gate dielectric layer and subsequently adding nitrogen to the titanium based layer. The metal work function layer is formed over the nitrogen-rich titanium-based barrier.

DESCRIPTION OF THE VIEWS OF THE DRAWING

FIG. 1 is a cross section of an example integrated circuit containing metal replacement gate transistors.

FIG. 2A through FIG. 2H are cross sections of the integrated circuit of FIG. 1, depicted in successive stages of fabrication.

FIG. 3 depicts the integrated circuit of FIG. 1 in an alternate process for adding nitrogen to the nitrogen-rich titanium-based barrier.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing metal replacement gates may be formed by forming a nitrogen-rich titanium-based barrier between a high-k gate dielectric layer and a metal work function layer of a PMOS transistor. The nitrogen-rich titanium-based barrier is 0.3 nanometers to 1.0 nanometers thick and has an atomic ratio of titanium to nitrogen of less than 43:57. The nitrogen-rich titanium-based barrier may be formed by forming a titanium based layer over the gate dielectric layer and subsequently adding nitrogen to the titanium based layer. The metal work function layer is formed over the nitrogen-rich titanium-based barrier.

FIG. 1 is a cross section of an example integrated circuit containing metal replacement gate transistors. The integrated circuit 100 is formed on a substrate 102 containing semiconductor material. The substrate 102 may be a single crystal bulk silicon wafer, a silicon wafer with an epitaxial layer, a silicon-on-insulator (SOI) wafer, a hybrid orientation technology (HOT) wafer with semiconductor regions of different crystal orientations, or other substrate 102 appropriate for forming the integrated circuit 100. The integrated circuit 100 includes an area for a metal replacement gate PMOS transistor 104, referred to herein as the PMOS transistor 104, and an area for a metal replacement gate n-channel metal oxide semiconductor (NMOS) transistor 106, referred to herein as the NMOS transistor 106. Field oxide 108 may be formed at a top surface of the substrate 102 to laterally isolate the PMOS transistor 104 from the NMOS transistor 106.

The PMOS transistor 104 includes a high-k gate dielectric layer 110 over the substrate 102, a nitrogen-rich titanium-based barrier 112 over the high-k gate dielectric layer 110 and a PMOS metal work function layer 114 over the nitrogen-rich titanium-based barrier 112. The high-k gate dielectric layer 110 in the PMOS transistor 104 may include hafnium, zirconium, tantalum, yttrium, and/or lanthanum, and may be 0.3 nanometers to 1.5 nanometers thick. The nitrogen-rich titanium-based barrier 112 has a thickness 116 of 0.3 nanometers to 1.0 nanometers immediately over the high-k gate dielectric layer 110 over the substrate 102, and has a ratio of titanium to nitrogen of less than 43:57. In one version of the instant example, the ratio of titanium to nitrogen may be 32:68 to 38:62. The PMOS metal work function layer 114 may be at least 2 nanometers thick may include titanium nitride. A gate fill metal 118 may be formed over the PMOS metal work function layer 114. The PMOS metal work function layer 114 and the gate fill metal 118 provide a metal replacement gate for the PMOS transistor 104. The metal replacement gate may optionally include other layers, such as a metal barrier layer between the PMOS metal work function layer 114 and the gate fill metal 118. In the instant example, the nitrogen-rich titanium-based barrier 112 and the high-k gate dielectric layer 110 extend up along sides of the PMOS metal work function layer 114, which extends up along sides of the gate fill metal 118. Other configurations of the high-k gate dielectric layer 110, the nitrogen-rich titanium-based barrier 112, PMOS metal work function layer 114 and the gate fill metal 118 are within the scope of the instant example. Forming the nitrogen-rich titanium-based barrier 112 to have the ratio of titanium to nitrogen of less than 43:57 may advantageously reduce diffusion of oxygen from the high-k gate dielectric layer 110 to the PMOS metal work function layer 114 and thus maintain a desirably low threshold voltage of the PMOS transistor 104.

The PMOS transistor 104 may include offset spacers 120 adjacent to vertical sides of the high-k gate dielectric layer 110. The offset spacers 120 may be 1 nanometer to 5 nanometers thick and include primarily silicon dioxide and possibly some silicon nitride. The PMOS transistor 104 may further include source/drain spacers 122 abutting the offset spacers 120. The source/drain spacers 122 may include one or more layers of silicon nitride, silicon oxynitride and/or silicon dioxide, and may be 10 nanometers to 40 nanometers wide. The PMOS transistor 104 includes p-type source/drain regions 124 in the substrate 102 adjacent to, and partially underlapping, the high-k gate dielectric layer 110 and the source/drain spacers 122. A layer of metal silicide 126 such as nickel silicide or cobalt silicide is disposed on the p-type source/drain regions 124 adjacent to the source/drain spacers 122.

The NMOS transistor 106 includes a high-k gate dielectric layer 128 over the substrate 102. The high-k gate dielectric layer 128 in the NMOS transistor 106 may have the same composition and structure as the high-k gate dielectric layer 110 in the PMOS transistor 104 as a result of being formed concurrently, or may have a different composition and/or structure. The NMOS transistor 106 may optionally include a portion of the nitrogen-rich titanium-based barrier 112 over the high-k gate dielectric layer 128 in the NMOS transistor 106. The NMOS transistor 106 includes an NMOS metal work function layer 130 is disposed over the high-k gate dielectric layer 128 and over the portion of the nitrogen-rich titanium-based barrier 112 if present. An optional metal barrier layer 132 may be formed over the NMOS metal work function layer 130, and a gate fill metal 134 may be formed over the NMOS metal work function layer 130 and over the metal barrier layer 132 if present. Forming the NMOS transistor 106 to have the portion of the nitrogen-rich titanium-based barrier 112 may advantageously reduce diffusion of oxygen from the high-k gate dielectric layer 128 to the NMOS metal work function layer 130 and thus desirably maintain a stable threshold voltage of the NMOS transistor 106.

The NMOS transistor 106 may include offset spacers 136 adjacent to vertical sides of the high-k gate dielectric layer 128. The offset spacers 136 may be 1 nanometer to 5 nanometers thick and include primarily silicon dioxide and possibly some silicon nitride. The NMOS transistor 106 may further include source/drain spacers 138 abutting the offset spacers 136. The source/drain spacers 138 of the NMOS transistor 106 may have a similar structure and composition to the source/drain spacers 122 of the PMOS transistor 104. The NMOS transistor 106 includes n-type source/drain regions 140 in the substrate 102 adjacent to, and partially underlapping, the high-k gate dielectric layer 128 and the source/drain spacers 138. The layer of metal silicide 126 is disposed on the n-type source/drain regions 140 adjacent to the source/drain spacers 138.

A dielectric fill layer 142 is disposed over the substrate 102 adjacent to the source/drain spacers 122 of the PMOS transistor 104 and to the source/drain spacers 138 of the NMOS transistor 106. The dielectric fill layer 142 may include one or more layers of silicon nitride, silicon dioxide, silicon oxynitride and/or other dielectric materials. The dielectric fill layer 142 may include an optional contact etch stop layer (CESL) of silicon nitride as a bottom sublayer. A main layer of the dielectric fill layer 142 may be primarily silicon dioxide or boron-phosphorus silicate glass (BPSG). Subsequent fabrication steps form metal contacts through the dielectric fill layer 142 to make electrical connections to the p-type source/drain regions 124 and the n-type source/drain regions 140 through the layer of metal silicide 126.

Figure 2A:
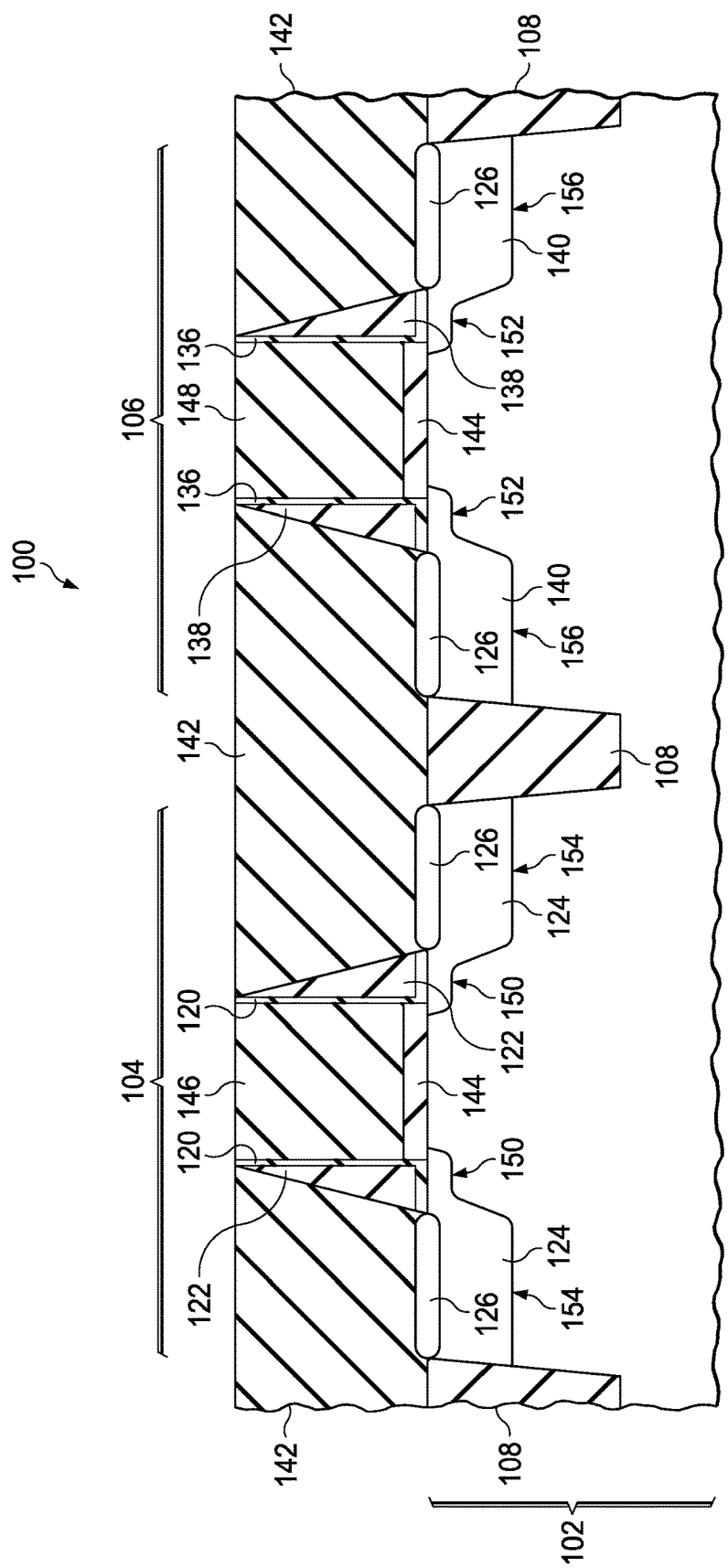

FIG. 2A through FIG. 2H are cross sections of the integrated circuit of FIG. 1, depicted in successive stages of fabrication. Referring to FIG. 2A, the integrated circuit 100 is formed on the substrate 102. The field oxide 108 is formed at the top surface of the substrate 102. The field oxide 108 may be formed by a shallow trench isolation (STI) process to provide a top surface of the field oxide 108 which is substantially coplanar with the top surface of the substrate 102. A sacrificial gate dielectric layer 144 is formed at the top surface of the substrate 102 in the area for the PMOS transistor 104 and the area for the NMOS transistor 106. The sacrificial gate dielectric layer 144 may be 1 nanometer to 10 nanometers thick and include primarily silicon dioxide formed by thermal oxidation of silicon in the substrate 102. A PMOS sacrificial gate 146 is formed over the sacrificial gate dielectric layer 144 in the area for the PMOS transistor 104, and an NMOS sacrificial gate 148 is formed over the sacrificial gate dielectric layer 144 in the area for the NMOS transistor 106. The PMOS sacrificial gate 146 and the NMOS sacrificial gate 148 may include primarily polycrystalline silicon, referred to as polysilicon, and may be 40 nanometers to 100 nanometers thick. The PMOS sacrificial gate 146 and the NMOS sacrificial gate 148 may be formed by forming a layer of polysilicon over the sacrificial gate dielectric layer 144 and forming a gate mask over the layer of polysilicon which covers areas for the PMOS sacrificial gate 146 and the NMOS sacrificial gate 148. The gate mask may include layers of hard mask material such as amorphous carbon, layers of antireflection material such as silicon nitride, and a photoresist pattern formed by a photolithographic process. Polysilicon is removed from areas exposed by the gate mask to leave the PMOS sacrificial gate 146 and the NMOS sacrificial gate 148. The gate mask is subsequently removed.

The offset spacers 120 of the PMOS transistor 104 may be formed thermal oxidation of the polysilicon in the PMOS sacrificial gate 146 and deposition of a conformal layer of silicon dioxide and/or silicon nitride followed by an anisotropic etch such as a reactive ion etch (RIE) process to remove the conformal layer from a top surface of the PMOS sacrificial gate 146. The offset spacers 136 of the NMOS transistor 106 may be formed in a similar manner. Thermal oxidation of the polysilicon in the NMOS sacrificial gate 148 may be done concurrently with the thermal oxidation of the polysilicon in the PMOS sacrificial gate 146.

P-type source/drain extensions 150 of the p-type source/drain regions 124 of the PMOS transistor 104 are formed after the offset spacers 120 of the PMOS transistor 104 are formed, by implanting p-type dopants such as boron into the substrate 102 adjacent to the PMOS sacrificial gate 146, using the offset spacers 120 to define a lateral extent of the implanted p-type dopants at edges of the PMOS sacrificial gate 146. Other elements, such as fluorine and carbon may be implanted with the p-type dopants to provide a desired distribution of the source/drain extensions 150 after subsequent thermal anneals. N-type dopants such as phosphorus may also be implanted at tilt angles of 20 degrees to 35 degrees into the substrate under the offset spacers 120 of the PMOS transistor 104 to provide a desired doping profile of the substrate 102 in a channel region of the PMOS transistor 104 between the source/drain extensions 150.

N-type source/drain extensions 152 of the n-type source/drain regions 140 of the NMOS transistor 106 are formed after the offset spacers 136 of the NMOS transistor 106 are formed, by implanting n-type dopants such as phosphorus into the substrate 102 adjacent to the NMOS sacrificial gate 148, using the offset spacers 136 to define a lateral extent of the implanted n-type dopants at edges of the NMOS sacrificial gate 148. Other elements such as carbon may be implanted with the n-type dopants to provide a desired distribution of the source/drain extensions 152 after subsequent thermal anneals. P-type dopants such as boron may also be implanted at tilt angles of 20 degrees to 35 degrees into the substrate under the offset spacers 136 of the NMOS transistor 106 to provide a desired doping profile of the substrate 102 in a channel region of the NMOS transistor 106 between the source/drain extensions 152.

The source/drain spacers 122 of the PMOS transistor 104 are formed after the source/drain extensions 150 of the p-type source/drain regions 124 of the PMOS transistor 104 are formed. The source/drain spacers 122 may be formed by forming one or more conformal layers of silicon nitride and/or silicon dioxide over the PMOS sacrificial gate 146 and the offset spacers 120, followed by an anisotropic etch to remove the conformal layers from the top surface of the PMOS sacrificial gate 146 to leave the source/drain spacers 122. Conformal silicon nitride layers may be formed by a plasma enhanced chemical vapor deposition (PECVD) process using bis (tertiary-butylamino) silane (BTBAS). Conformal layers of silicon dioxide may be formed by a PECVD process using tetraethyl orthosilicate, also known as tetraethoxysilane (TEOS). The source/drain spacers 138 of the NMOS transistor 106 are formed in a similar manner. A portion, and possibly all, of the source/drain spacers 138 of the NMOS transistor 106 may be formed concurrently with a corresponding portion of the source/drain spacers 122 of the PMOS transistor 104.

P-type deep source/drain regions 154 of the p-type source/drain regions 124 of the PMOS transistor 104 are formed after the source/drain spacers 122 of the PMOS transistor 104 are formed, by implanting p-type dopants such as boron, and possibly gallium or indium, into the substrate 102 adjacent to the PMOS sacrificial gate 146, using the source/drain spacers 122 to define a lateral extent of the deep source/drain regions 154 proximate to edges of the PMOS sacrificial gate 146. A subsequent thermal anneal diffuses and activates the implanted dopants of the deep source/drain regions 154 and the source/drain extensions 150 to form the source/drain regions 124 of the PMOS transistor 104.

N-type deep source/drain regions 156 of the n-type source/drain regions 140 of the NMOS transistor 106 are formed after the source/drain spacers 138 of the NMOS transistor 106 are formed, by implanting n-type dopants such as phosphorus and arsenic, and possibly antimony, into the substrate 102 adjacent to the NMOS sacrificial gate 148, using the source/drain spacers 138 to define a lateral extent of the deep source/drain regions 156 proximate to edges of the NMOS sacrificial gate 148. A subsequent thermal anneal diffuses and activates the implanted dopants of the deep source/drain regions 156 and the source/drain extensions 152 to form the source/drain regions 140 of the NMOS transistor 106. The thermal anneal to form the source/drain regions 140 of the NMOS transistor 106 may be done concurrently with the thermal anneal to form the source/drain regions 124 of the PMOS transistor 104.

After the source/drain regions 124 of the PMOS transistor 104 and the source/drain regions 140 of the NMOS transistor 106 are formed, the layer of metal silicide 126 is formed on the source/drain regions 124 and 140. The layer of metal silicide 126 may be formed by depositing a layer of refractory metal, such as nickel, cobalt, titanium, platinum, molybdenum or chromium, on an existing top surface of the integrated circuit 100, heating the integrated circuit 100 to react a portion of the metal with exposed silicon in active areas of the integrated circuit 100, and selectively removing unreacted metal from the integrated circuit 100 surface by exposing the integrated circuit 100 to wet etchants including a mixture of sulfuric acid and hydrogen peroxide. The PMOS sacrificial gate 146 and the NMOS sacrificial gate 148 may have optional dielectric caps which block formation of metal silicide on the polysilicon, to facilitate subsequent removal of the polysilicon for the metal gate replacement process.

The dielectric fill layer 142 is subsequently formed over an existing top surface of the integrated circuit 100, covering the PMOS sacrificial gate 146 and the NMOS sacrificial gate 148. The dielectric fill layer 142 may be formed by first forming a CESL of silicon nitride over the layer of metal silicide 126 on the source/drain regions 124 and 140 and over the PMOS sacrificial gate 146 and the NMOS sacrificial gate 148. The CESL may have compressive or tensile stress to enhance mobility in the channel region of the PMOS transistor 104 or the NMOS transistor 106. Formation of the dielectric fill layer 142 may be continued by forming a main layer which is primarily silicon dioxide or BPSG by a high aspect ratio process (HARP) using TEOS and ozone, or spin coating with methylsilsesquioxane (MSQ) followed by thermal curing. Dielectric material of the dielectric fill layer 142 is removed from the top surfaces of the PMOS sacrificial gate 146 and the NMOS sacrificial gate 148 by a chemical mechanical polish (CMP) process and/or a plasma etchback process. The polysilicon in the PMOS sacrificial gate 146 and the NMOS sacrificial gate 148 is exposed for subsequent removal. The dielectric fill layer 142 covers the layer of metal silicide 126 on the source/drain regions 124 and 140.

Figure 2B:
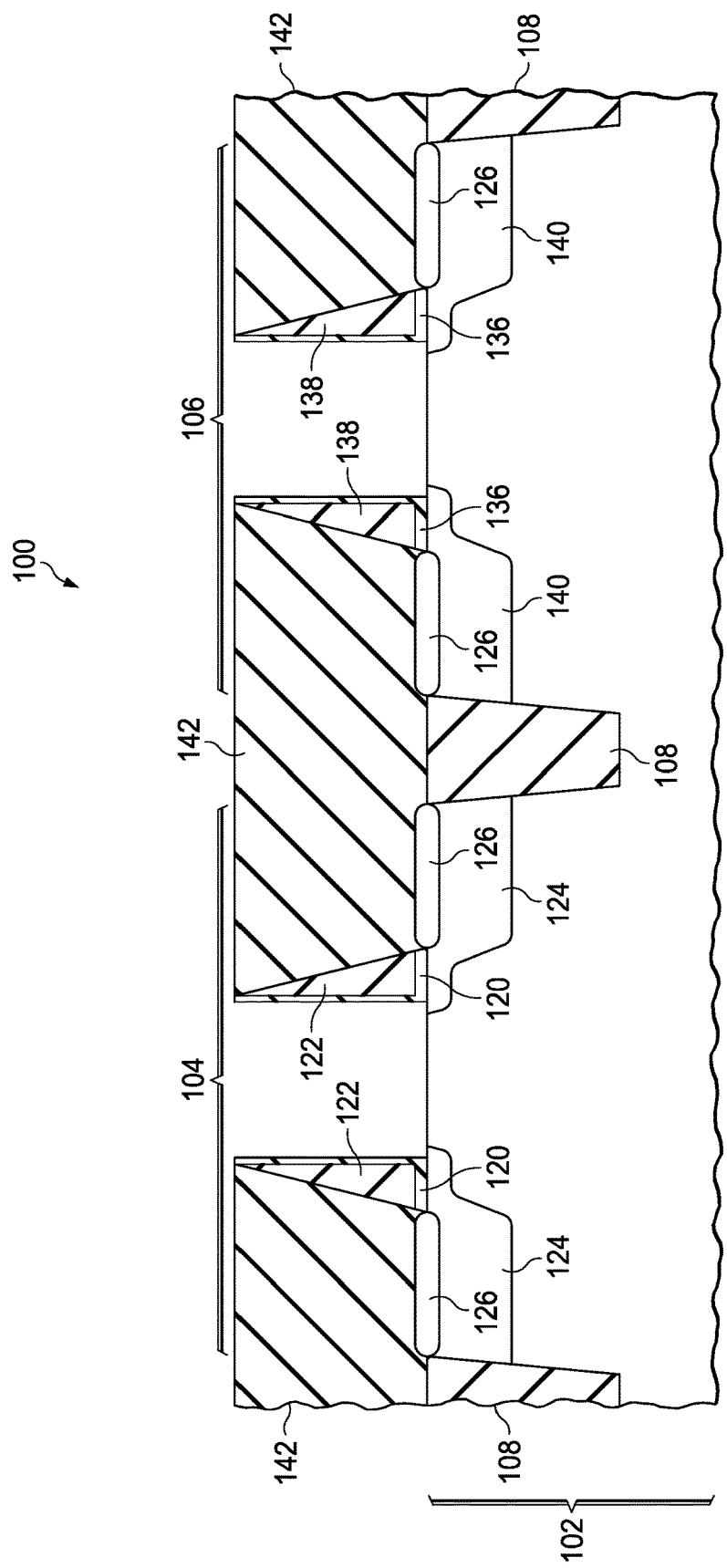

Referring to FIG. 2B, the PMOS sacrificial gate 146, the NMOS sacrificial gate 148 and the sacrificial gate dielectric layer 144 of FIG. 2A are removed without significantly degrading the substrate 102 under the sacrificial gate dielectric layer 144. Polysilicon in the PMOS sacrificial gate 146 and the NMOS sacrificial gate 148 may be removed using an aqueous solution of tetramethyl ammonium hydroxide or ammonium hydroxide at a concentration 0.5 percent and 5 percent at a temperature between 25° C. and 50° C. The sacrificial gate dielectric layer 144 may be removed using a dilute buffered aqueous solution of hydrofluoric acid. A portion, or all, of the offset spacers 120 and 136 may be removed during removal of the sacrificial gate dielectric layer 144. The layer of metal silicide 126 is protected during the removal of the PMOS sacrificial gate 146, the NMOS sacrificial gate 148 and the sacrificial gate dielectric layer 144 by the dielectric fill layer 142.

Figure 2C:
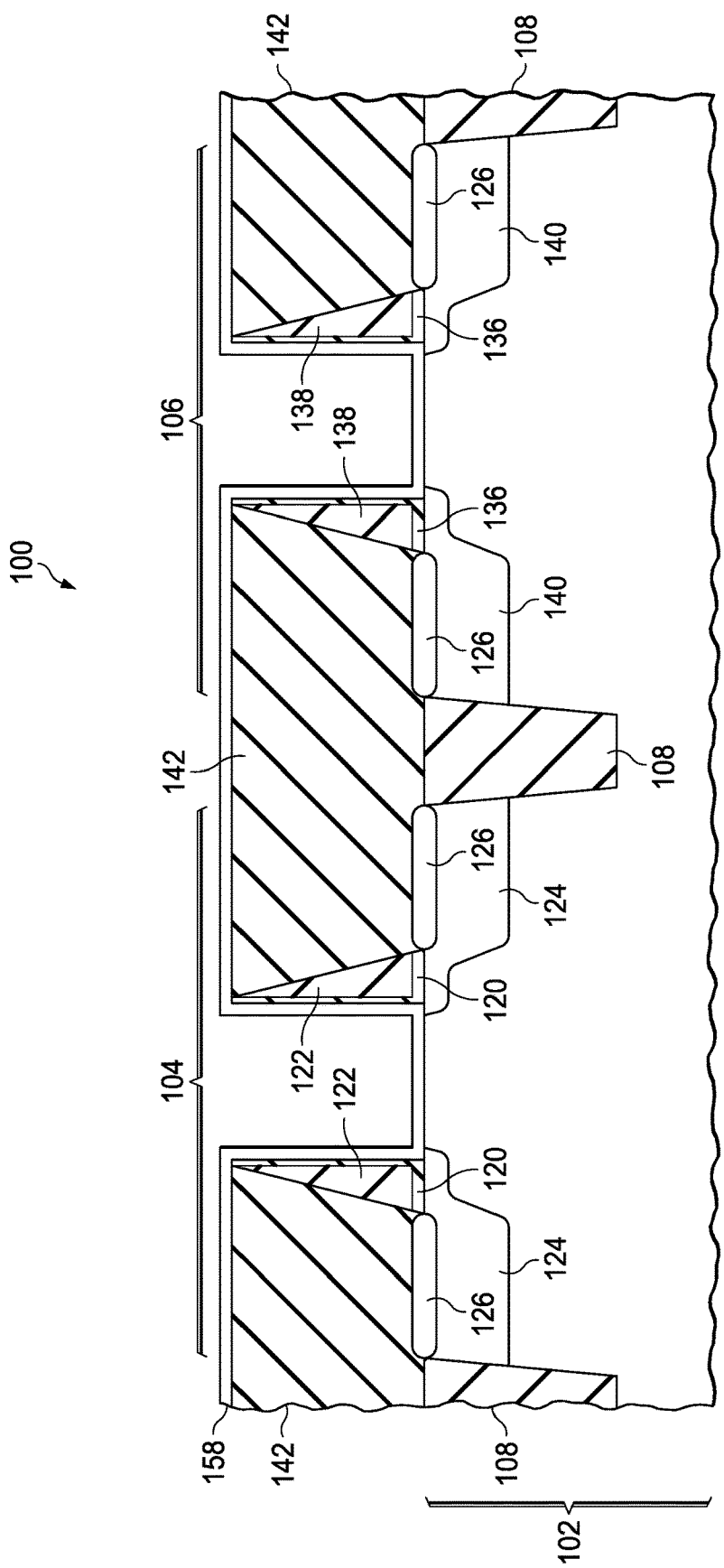

Referring to FIG. 2C, a layer of high-k gate dielectric material 158 is formed over an existing top surface of the integrated circuit 100, over the dielectric fill layer 142 and extending over the substrate 102 between the offset spacers 120 in the PMOS transistor 104 and between the offset spacers 136 in the NMOS transistor 106. A monolayer of silicon oxide, not shown in FIG. 2C, may optionally be formed on the substrate 102 prior to forming the layer of high-k gate dielectric material 158. The layer of high-k gate dielectric material 158 may include oxides and/or nitrides of hafnium, zirconium, tantalum, yttrium, and/or lanthanum. The layer of high-k gate dielectric material 158 may be formed by PECVD and/or ALD processes. The layer of high-k gate dielectric material 158 is formed to have a desired thickness over the substrate 102 between the offset spacers 120 in the PMOS transistor 104 and between the offset spacers 136 in the NMOS transistor 106. In one version of the instant example, the layer of high-k gate dielectric material 158 may be removed from the NMOS transistor 106 and a separate NMOS high-k dielectric layer formed in the NMOS transistor 106. Being Referring to FIG. 2D, a titanium-based layer 160 is formed over the layer of high-k gate dielectric material 158, so that the titanium-based layer 160 is 0.3 nanometers to 1.0 nanometers thick over the layer of high-k gate dielectric material 158 between the offset spacers 120 in the PMOS transistor 104. The titanium-based layer 160 may be primarily titanium, formed by a sputter process, or may be primarily titanium nitride formed by an ALD process. Other compositions of the titanium-based layer 160 with titanium content above 45 atomic percent are within the scope of the instant example.

Figure 2D:
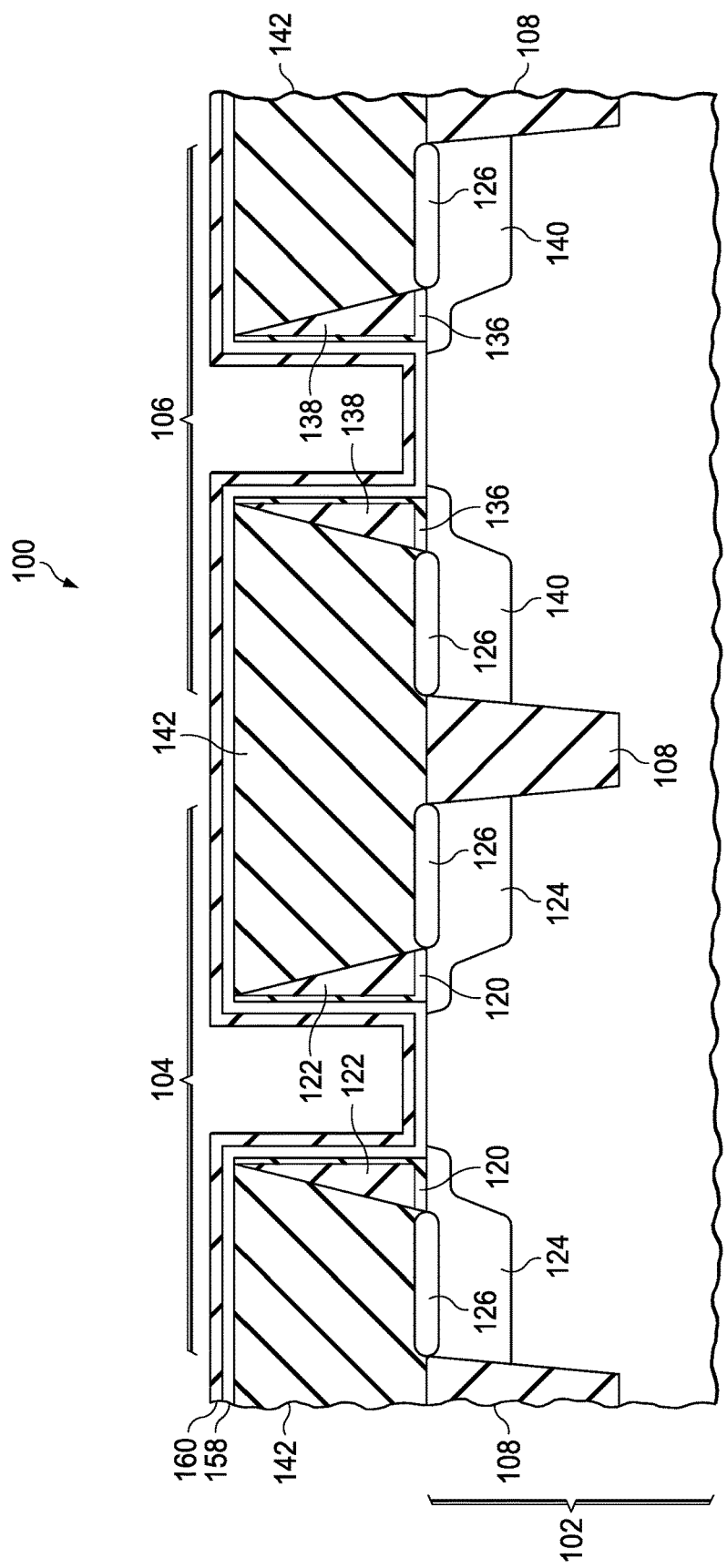
Figure 2E:
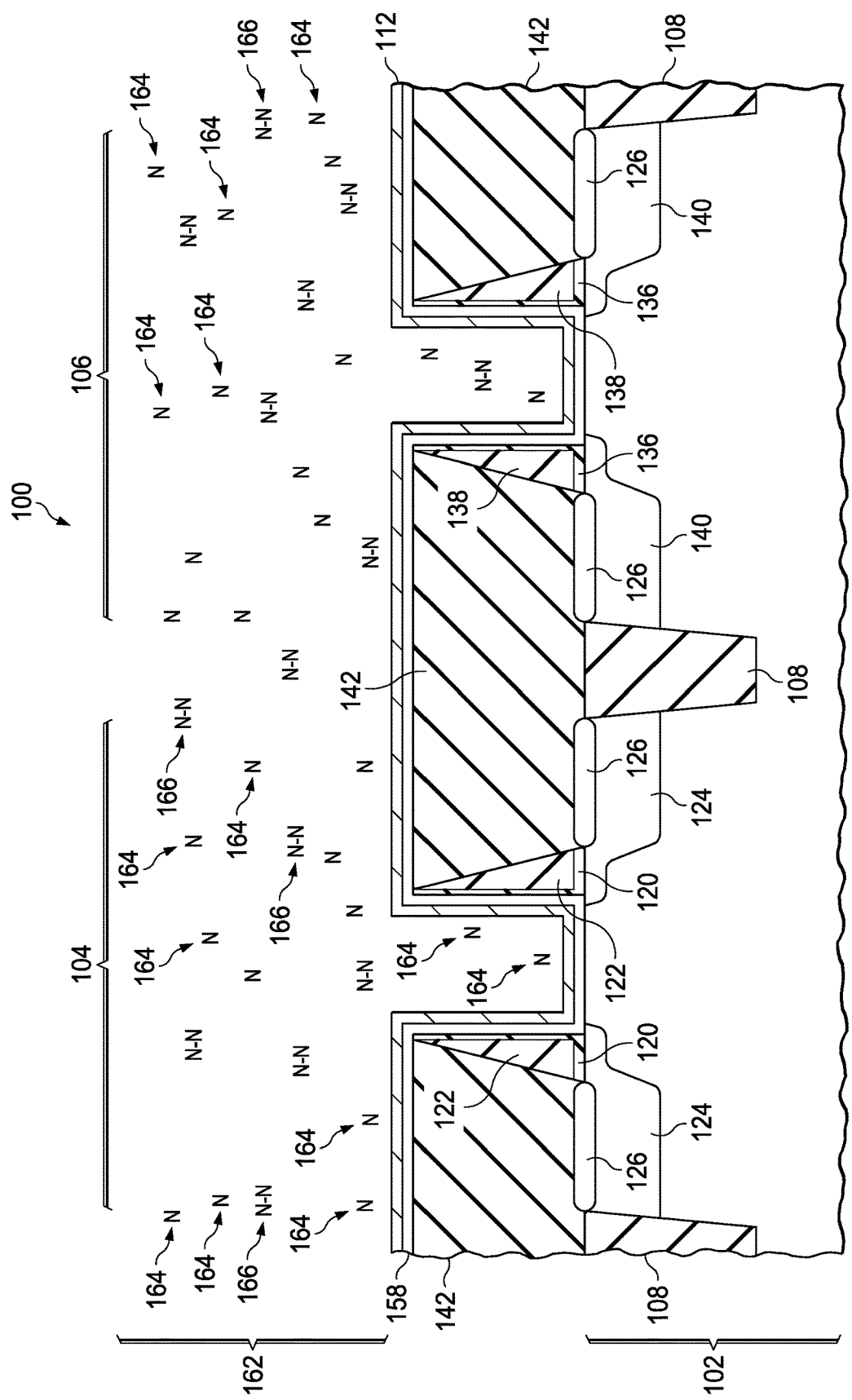

Referring to FIG. 2E, the titanium-based layer 160 of FIG. 2D is exposed to a nitrogen-containing plasma 162 containing atomic nitrogen radicals 164 and possibly nitrogen molecules 166 to add nitrogen and form the nitrogen-rich titanium-based barrier 112 of FIG. 1. In one version of the instant example, in which the substrate 102 is a 300 millimeter wafer, the nitrogen-containing plasma 162 may be formed by flowing nitrogen ($N_2$) gas at a flow rate of 50 standard cubic centimeters per minute (sccm) to 100 sccm to provide a pressure of 50 millitorr to 100 millitorr. 500 watts to 800 watts of radio-frequency (RF) power is provided to generate the nitrogen-containing plasma 162. The substrate 102 is disposed on a substrate plate at 25° C. to 30° C. and exposed to the nitrogen-containing plasma 162 for 10 seconds to 60 seconds. In another version of the instant example, in which the substrate 102 is a 300 millimeter wafer, the nitrogen-containing plasma 162 may be formed by flowing nitrogen gas at a flow rate of 10 sccm to 70 sccm and argon gas at a flow rate of 800 sccm to 1200 sccm to provide a pressure of 100 millitorr to 300 millitorr. 800 watts to 1200 watts of RF power is provided to generate the nitrogen-containing plasma 162. The substrate 102 is disposed on a heated substrate plate at 200° C. to 300° C. and exposed to the nitrogen-containing plasma 162 for 10 seconds to 60 seconds. As a result of exposure to the nitrogen-containing plasma 162, the nitrogen-rich titanium-based barrier 112 has ratio of titanium to nitrogen of less than 43:57. In one version of the instant example, the ratio of titanium to nitrogen may be 32:68 to 38:62.

Figure 2F:
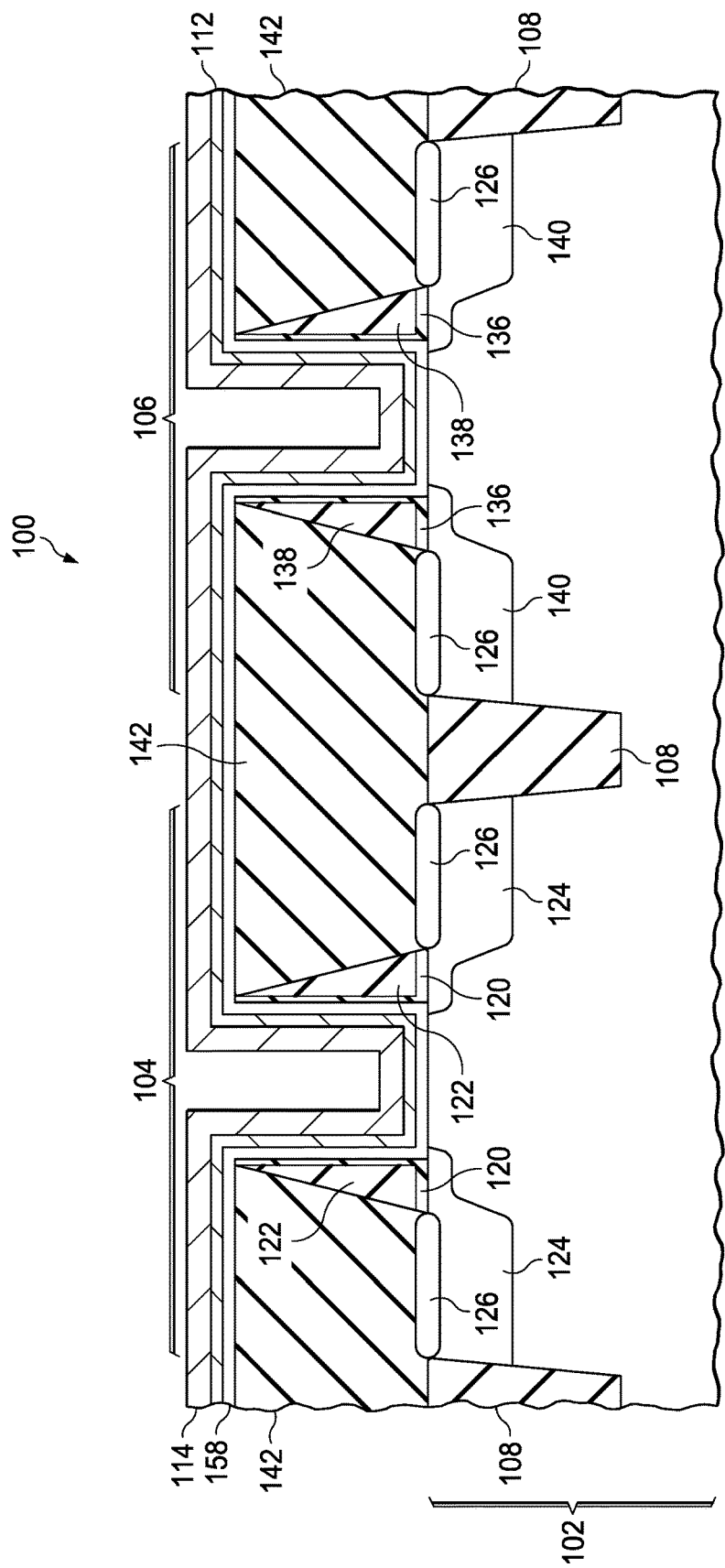

Referring to FIG. 2F, the PMOS metal work function layer 114 is formed over the nitrogen-rich titanium-based barrier 112, extending onto the nitrogen-rich titanium-based barrier 112 between the offset spacers 120 in the PMOS transistor 104. The PMOS metal work function layer 114 is formed over the nitrogen-rich titanium-based barrier 112 without exposing the nitrogen-rich titanium-based barrier 112 to ambient air or an oxidizing ambient such as ozone or an oxygen plasma, thus advantageously protecting the nitrogen-rich titanium-based barrier 112 from chemical degradation. The PMOS metal work function layer 114 may be formed in a same chamber as the nitrogen-rich titanium-based barrier 112 or may be formed in a cluster tool with the nitrogen-rich titanium-based barrier 112. The PMOS metal work function layer 114 may include titanium nitride and may be formed by an ALD process. Other compositions and/or formation processes for the PMOS metal work function layer 114 are within the scope of the instant example.

Figure 2G:
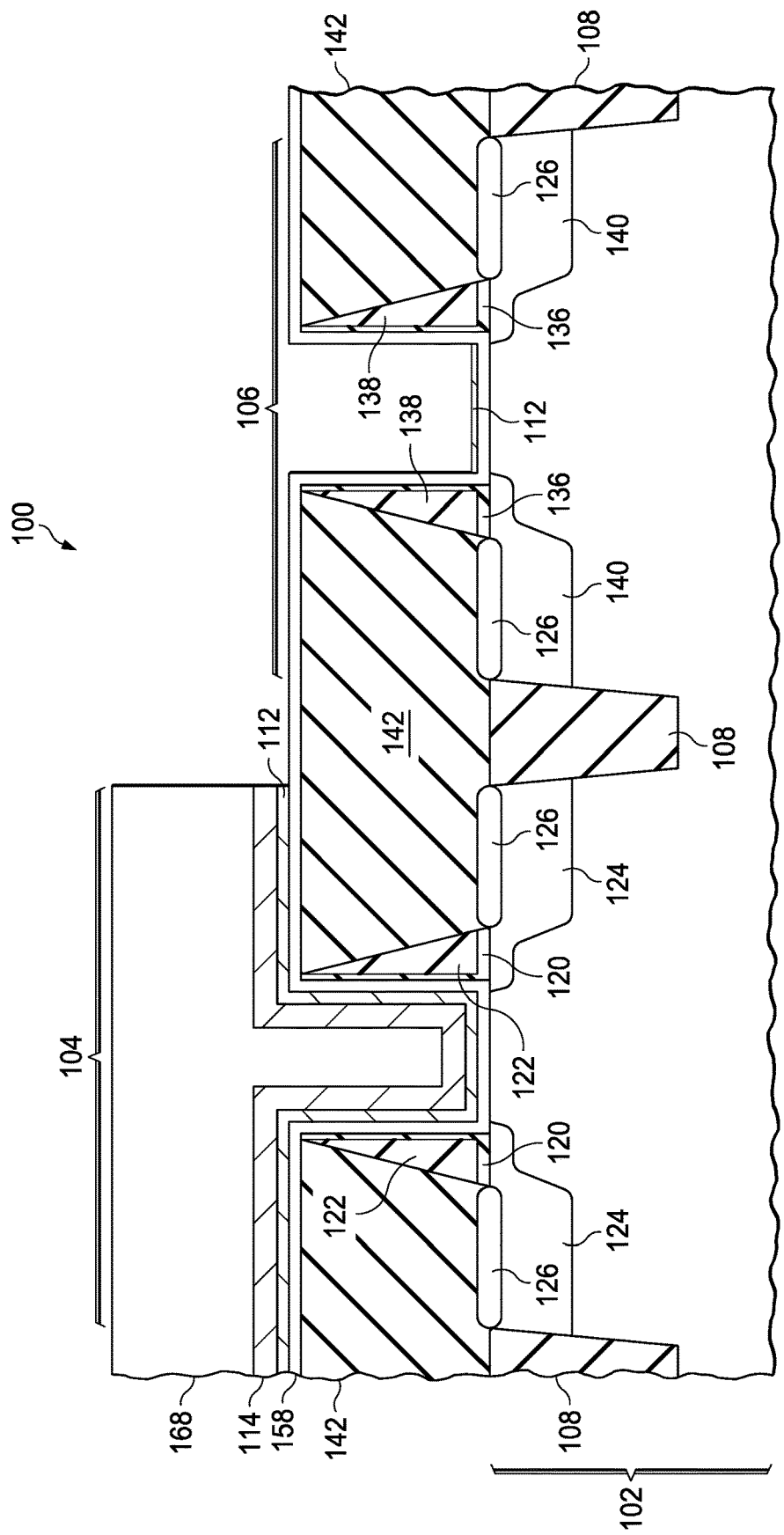

Referring to FIG. 2G, a barrier mask 168 is formed over the PMOS metal work function layer 114 so as to cover at least an area between the offset spacers 120 in the PMOS transistor 104 and to expose at least an area between the offset spacers 136 in the NMOS transistor 106. The PMOS metal work function layer 114 is removed in areas exposed by the barrier mask 168. The PMOS metal work function layer 114 may be removed by a timed wet etch using an aqueous mixture of acid and hydrogen peroxide. A portion, or possibly all, of the nitrogen-rich titanium-based barrier 112 may also be removed in areas exposed by the barrier mask 168. A portion of the nitrogen-rich titanium-based barrier 112 may remain in the NMOS transistor 106 over the layer of high-k gate dielectric material 158 between the offset spacers 136 as depicted in FIG. 2G. Forming the PMOS metal work function layer 114 over the nitrogen-rich titanium-based barrier 112 before removing a portion or all of the nitrogen-rich titanium-based barrier 112 in the NMOS transistor 106 may advantageously protect the nitrogen-rich titanium-based barrier 112 from chemical degradation.

Figure 2H:
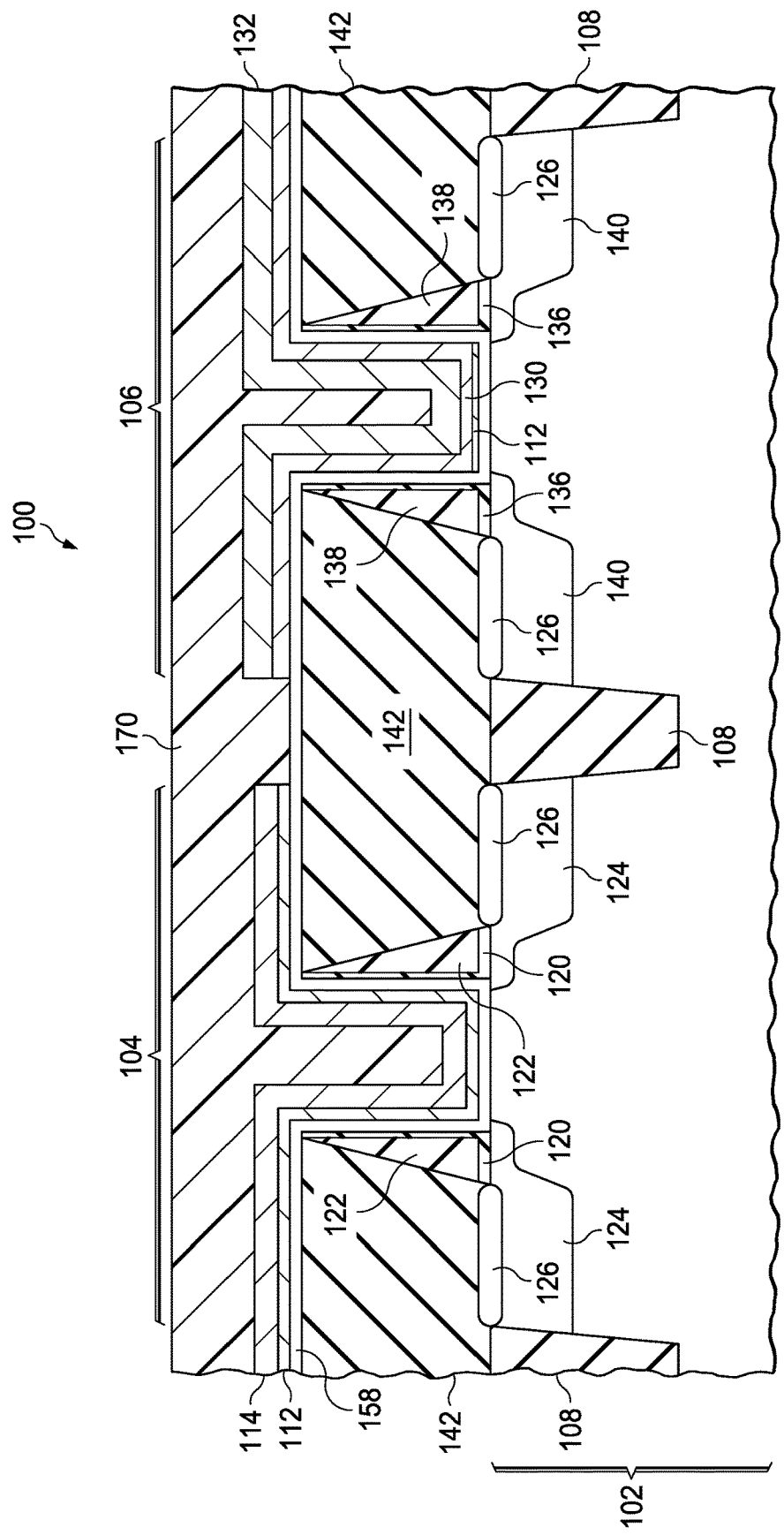

Referring to FIG. 2H, the NMOS metal work function layer 130 is formed over the layer of high-k gate dielectric material 158 by a sputter process, a metal-organic chemical vapor deposition (MOCVD) process, an ALD process or other deposition process. The optional metal barrier layer 132 may be formed over the NMOS metal work function layer 130. The NMOS metal work function layer 130 and the metal barrier layer 132 may be removed from the PMOS transistor 104 as depicted in FIG. 2H. A layer of fill metal 170 is formed over an existing top surface of the integrated circuit 100, filling any spaces between the offset spacers 120 in the PMOS transistor 104 and between the offset spacers 136 in the NMOS transistor 106. The layer of fill metal 170 may include aluminum, cobalt-aluminum alloy or other low resistance metal. The layer of fill metal 170 provides the gate fill metal 118 of FIG. 1 of the PMOS transistor 104 and may provide the gate fill metal 134 of FIG. 1 of the NMOS transistor 106. Alternately, the layer of fill metal 170 may be removed from the NMOS transistor 106 and a separate layer of fill metal formed on the NMOS transistor to provide the gate fill metal 134 of the NMOS transistor 106. Fabrication of the integrated circuit 100 is continued by removal of the layer of fill metal 170, the PMOS metal work function layer 114, the nitrogen-rich titanium-based barrier 112, the metal barrier layer 132 and the NMOS metal work function layer 130 from over a top surface of the dielectric fill layer 142, to form the structure of FIG. 1, for example by a metal CMP process. In an alternate version of the instant example, the layer of high-k dielectric material 112 may be formed before the sacrificial gates 146 and 148 of FIG. 2A are formed.

Figure 3:
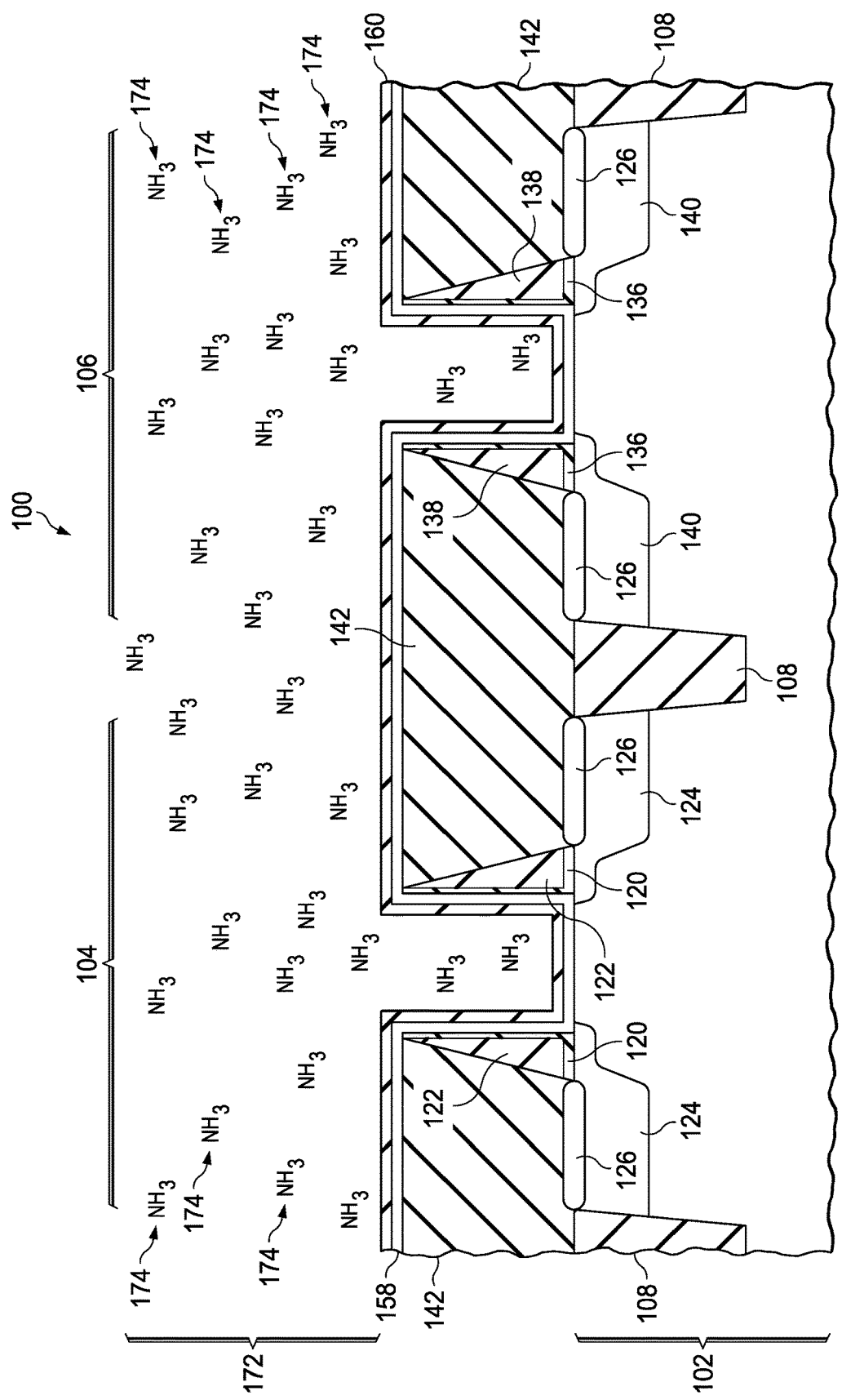

FIG. 3 depicts the integrated circuit of FIG. 1 in an alternate process for adding nitrogen to the nitrogen-rich titanium-based barrier. Fabrication of the integrated circuit 100 proceeds as described in reference to FIG. 2A through FIG. 2D. The titanium-based layer 160 is formed over the layer of high-k gate dielectric material 158, so that the titanium-based layer 160 is 0.3 nanometers to 1.0 nanometers over the layer of high-k gate dielectric material 158 between the offset spacers 120 in the PMOS transistor 104. The titanium-based layer 160 is exposed to an ammonia-containing ambient 172 containing ammonia ($NH_3$) molecules 174 to add nitrogen and form the nitrogen-rich titanium-based barrier 112 of FIG. 1. In one version of the instant example, in which the substrate 102 is a 300 millimeter wafer, the ammonia-containing ambient 172 may be formed by flowing ammonia gas at a flow rate of 1 standard liters per minute (slm) to 3 slm to provide a pressure of 300 torr to 760 torr while the substrate 102 is disposed on a heated substrate plate at 500° C. to 800° C., for 1 minute to 30 minutes. As a result of exposure to the ammonia-containing ambient 172, the nitrogen-rich titanium-based barrier 112 has ratio of titanium to nitrogen of less than 43:57. In one version of the instant example, the ratio of titanium to nitrogen may be 32:68 to 38:62.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a substrate comprising semiconductor material; and
   a p-channel metal oxide semiconductor (PMOS) transistor, comprising:
   a high-k gate dielectric layer over said substrate;
   a nitrogen-rich titanium-based barrier directly on said high-k gate dielectric layer; and
   a PMOS metal work function layer over said nitrogen-rich titanium-based barrier, wherein said PMOS metal work function layer is part of a metal gate of said PMOS transistor, wherein the metal gate includes a fill metal layer over the PMOS metal work function layer.

2. The integrated circuit of claim 1, wherein a ratio of titanium to nitrogen in the nitrogen-rich titanium-based barrier is from 32:68 to 38:62.

3. The integrated circuit of claim 1, wherein said PMOS metal work function layer includes titanium nitride.

4. The integrated circuit of claim 1, wherein said high-k gate dielectric layer includes hafnium.

5. The integrated circuit of claim 1, further comprising an n-channel metal oxide semiconductor (NMOS) transistor, comprising:
   a high-k gate dielectric layer over said substrate;
   a portion of said nitrogen-rich titanium-based barrier over said high-k gate dielectric layer of said NMOS transistor; and
   an NMOS metal work function layer over said portion of said nitrogen-rich titanium-based barrier, wherein said NMOS metal work function layer is part of a metal gate of said NMOS transistor.

6. The integrated circuit of claim 4, wherein said high-k gate dielectric layer is 0.3 nanometers to 1.5 nanometers thick.

7. A method of forming an integrated circuit, comprising the steps:
   providing a substrate comprising semiconductor material;
   removing a PMOS sacrificial gate from a PMOS transistor of said integrated circuit;
   forming a titanium-based layer over a high-k gate dielectric layer in said PMOS transistor, said high-k gate dielectric layer being disposed over said substrate;
   adding nitrogen to said titanium-based layer to form a nitrogen-rich titanium-based barrier;
   forming a PMOS metal work function layer over said nitrogen-rich titanium-based barrier;
   forming a layer of fill metal over said PMOS metal work function layer; and
   removing said layer of fill metal and said PMOS metal work function layer from areas outside a gate of said PMOS transistor.

8. The method of claim 7, wherein said titanium-based layer is primarily titanium.

9. The method of claim 7, wherein said titanium-based layer is primarily titanium nitride.

10. The method of claim 7, wherein said step of adding nitrogen comprises flowing nitrogen ($N_2$) gas at a flow rate of 50 standard cubic centimeters per minute (sccm) to 100 sccm to provide a pressure of 50 millitorr to 100 millitorr, providing 500 watts to 800 watts of radio-frequency (RF) power to said nitrogen gas so as to generate a nitrogen-containing plasma, disposing said substrate on a substrate plate at 25° C. to 30° C., and exposing said titanium-based layer to said nitrogen-containing plasma for 10 seconds to 60 seconds while said substrate is disposed on said substrate plate.

11. The method of claim 7, wherein said step of adding nitrogen comprises flowing nitrogen gas at a flow rate of 10 sccm to 70 sccm and argon gas at a flow rate of 800 sccm to 1200 sccm to provide a pressure of 100 millitorr to 300 millitorr, providing 800 watts to 1200 watts of RF power to said nitrogen gas and said argon gas so as to generate a nitrogen-containing plasma, disposing said substrate on a substrate plate at 200° C. to 300° C., and exposing said titanium-based layer to said nitrogen-containing plasma for 10 seconds to 60 seconds while said substrate is disposed on said substrate plate.

12. The method of claim 7, wherein said step of adding nitrogen comprises flowing ammonia ($NH_3$) gas at a flow rate of 1 standard liters per minute (slm) to 3 slm to provide a pressure of 300 torr to 760 torr so as to form an ammonia-containing ambient, disposing said substrate on a substrate plate at 500° C. to 800° C., and exposing said titanium-based layer to said ammonia-containing ambient for 1 minute to 30 minutes while said substrate is disposed on said substrate plate.

13. The method of claim 7, wherein said ratio of titanium to nitrogen is 32:68 to 38:62.

14. The method of claim 7, wherein said PMOS metal work function layer includes titanium nitride.

15. The method of claim 7, wherein said high-k gate dielectric layer includes hafnium.

16. The method of claim 7, further comprising the step of removing said PMOS metal work function layer and at least a portion of said nitrogen-rich titanium-based barrier from an NMOS transistor of said integrated circuit, prior to said step of forming said layer of fill metal.

17. The method of claim 7, wherein said step of forming said PMOS metal work function layer is performed in a same chamber as said step of adding nitrogen to said titanium-based layer.

18. The method of claim 7, wherein said step of forming said PMOS metal work function layer and said step of adding nitrogen to said titanium-based layer are performed in a same cluster tool.

19. The method of claim 9, wherein said titanium nitride is formed by an atomic layer deposition (ALD) process.

20. An integrated circuit, comprising:
  a substrate comprising semiconductor material; and
  a p-channel metal oxide semiconductor (PMOS) transistor, comprising:
    a high-k gate dielectric layer comprising hafnium over said substrate;
    a nitrogen-rich titanium-based barrier over said high-k gate dielectric layer; and
    a PMOS metal work function layer comprising titanium nitride over said nitrogen-rich titanium-based barrier, wherein said PMOS metal work function layer is part of a metal gate of said PMOS transistor, wherein the metal gate includes a fill metal layer over the PMOS metal work function layer; and
  an n-channel metal oxide semiconductor (NMOS) transistor, comprising:
    the high-k gate dielectric layer over said substrate;
    a portion of said nitrogen-rich titanium-based barrier over said high-k gate dielectric layer in said NMOS transistor;
    an NMOS metal work function layer over said portion of said nitrogen-rich titanium-based barrier, wherein said NMOS metal work function layer is part of a metal gate of said NMOS transistor, wherein the metal gate includes the fill metal layer over the NMOS metal work function layer.

\* \* \* \* \*